(12) United States Patent
Main et al.

(10) Patent No.: US 6,265,917 B1
(45) Date of Patent: Jul. 24, 2001

(54) CIRCUIT AND METHOD FOR ALTERING THE FREQUENCY OF A SIGNAL

(75) Inventors: William Eric Main, Mesa; Jeffrey C. Durec, Chandler, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/425,353

(22) Filed: Oct. 22, 1999

(51) Int. Cl.$^7$ ................................ H03B 19/00; H03L 7/00
(52) U.S. Cl. ........................ 327/122; 327/100; 327/119
(58) Field of Search ................................. 327/105, 113, 327/119, 122, 100

(56) References Cited

U.S. PATENT DOCUMENTS 4,040,075 * 8/1977 Nakamura et al. ............... 327/113
4,052,626 * 10/1977 Tuma et al. ...................... 327/122

\* cited by examiner

*Primary Examiner*—Dinh T. Le
(74) *Attorney, Agent, or Firm*—Robert F. Hightower

(57) ABSTRACT

A circuit for doubling the frequency of an input signal. The circuit includes a full-wave rectifier that rectifies the input signal to generate an output signal with double the frequency of the input signal. The output signal is compared to a predetermined voltage. Based on this comparison, a control signal is fed back to the full-wave rectifier and the output of the rectifier is adjusted to a predetermined level. In this manner the frequency of the input signal is doubled, and the output power is maintained constant, independent of the input power level.

18 Claims, 2 Drawing Sheets

CIRCUIT AND METHOD FOR ALTERING THE FREQUENCY OF A SIGNAL

FIELD OF THE INVENTION

The present invention relates, in general, to circuits and, more particularly, to both a circuit and method for altering the frequency of an input signal while generating an output signal with a power level that is substantially independent of the power level of the input signal.

BACKGROUND OF THE INVENTION

Some electronic devices require two different frequencies that are related to each other by approximately a 2:1 ratio. For example, a dual-band cellular telephone may operate at both 800 megahertz (MHz) and at 1900 MHz. Past means and methods of producing the two frequencies have suffered from several drawbacks. For example, the use of two different frequency generators adds to the size and to the cost of the product. Using one frequency generator coupled to a frequency-doubling circuit is a way around that limitation. However, past frequency doubling circuits suffer from a multitude of drawbacks.

Thus, it would be advantageous to produce a doubled frequency that does not require many external components and that has an output level substantially independent of the input level.

DETAILED DESCRIPTION OF THE DRAWINGS

Figure 1:
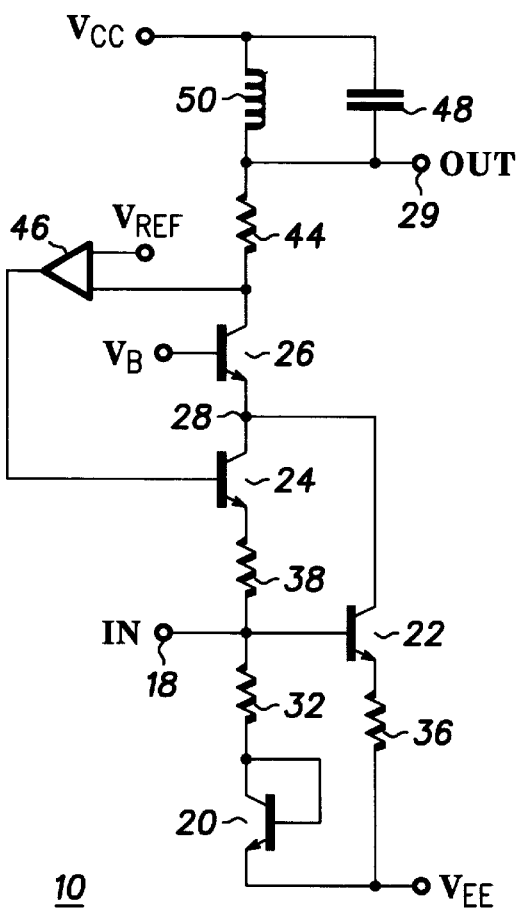
FIG. 1 is a schematic diagram of a frequency doubling circuit in accordance with a first embodiment of the present invention.

FIG. 1 is a schematic diagram of a frequency doubling circuit 10 in accordance with a first embodiment of the present invention. An input signal labeled IN, with a frequency f, is applied to an input terminal 18. An output signal labeled OUT is generated at an output terminal 29 and has a frequency of 2*f, i.e., double the frequency of signal IN.

Input terminal 18 is coupled through a resistor 32 to the collector of a bipolar junction transistor 20 and through a resistor 38 to the emitter of a bipolar junction transistor 24. Transistor 20 is a diode-connected transistor, wherein the base of transistor 20 is connected to its collector. The emitter of transistor 20 is coupled for receiving a source of operating potential or power supply voltage such as, for example, supply voltage VEE. Transistor 20 forms a current mirror with a bipolar junction transistor 22 by coupling the emitters of transistors 20 and 22 together through a resistor 36 and coupling the base of transistor 22 to the collector and the base of transistor 20. The collector of transistor 20 serves as the input terminal of the current mirror and the collector of transistor 22 serves as the output terminal of the current mirror.

It should be noted that the base of a bipolar transistor is referred to as the control electrode and the collector and emitter electrodes of the bipolar transistor are referred to as current carrying electrodes or conduction electrodes. The gate electrode of a Field Effect Transistor (FET) is also referred to as a control electrode and the drain and source electrodes of a FET are referred to as conduction electrodes.

Bipolar junction transistor 24 is coupled to the current mirror to form a full-wave rectifier. The emitter of transistor 24 is coupled to input terminal 18 and the collector of transistor 24 is coupled to the collector of transistor 22 to form a node 28. Node 28 serves as the output terminal for the full-wave rectifier. Signal IN is rectified so that the frequency of a rectified signal generated at node 28 is double the frequency of signal IN received at input terminal 18.

Resistors 32, 36, and 38 increase the linearity of circuit 10 so that the input impedance at terminal 18 is at a predetermined level. By way of example, resistors 32, 36, and 38 are each 60 ohms ($\Omega$) in order to set the input impedance at terminal 18 to 50 $\Omega$.

A bipolar junction transistor 26 is used in a common base configuration to buffer the output of the full-wave rectifier from any output load at terminal 29. In other words, transistor 26 isolates node 28 from the output impedance of a load at output terminal 29. A base voltage $V_B$, applied at the base of transistor 26, serves to bias transistor 26. The emitter of transistor 26 is coupled to the output of the full-wave rectifier at the collectors of transistors 22 and 24. The collector of transistor 26 is coupled to a resistor 44. Transistor 26 operates as a buffer amplifier, wherein the emitter of transistor 26 is the input terminal of the buffer amplifier and the collector of emitter 26 is the output terminal of the buffer amplifier. Resistor 44 has a first terminal connected to the collector of transistor 26 and serves to provide a Direct Current (DC) signal to a comparator amplifier 46, more fully described below.

A tank circuit comprising an inductor 50 and a capacitor 48 is coupled to a second terminal of resistor 44. A first terminal of inductor 50 and a first terminal of capacitor 48 are connected to each other and to output terminal 29. The second terminals of inductor 50 and capacitor 48 are coupled for receiving a power supply voltage such as, for example, supply voltage $V_{CC}$. Inductor 50 and capacitor 48 operate as a band-pass filter. The values of inductor 50 and capacitor 48 are chosen so that frequencies other than the desired frequency are rejected. In this example, the desired frequency of signal OUT at terminal 29 is twice the frequency of signal IN at terminal 18.

A comparator amplifier 46 compares the DC voltage level at the collector of transistor 26 to a reference voltage $V_{REF}$. In other words, comparator amplifier 46 compares the DC component of signal OUT at its first input terminal to signal $V_{REF}$ at its second input terminal. A control signal is generated at the output terminal of comparator amplifier 46 in response to the comparison at its input terminals. The control signal at the output terminal of comparator amplifier 46 is transmitted to the base of transistor 24 as a form of biasing. Comparator amplifier 46 serves as a feedback circuit for controlling the output power level at output terminal 29. In particular, the control signal at the output terminal of comparator amplifier 46 is a feedback signal, which is transmitted to the full-wave rectifier at the base of transistor 24 for controlling the power level at node 28.

If the output power level at the output of the full-wave rectifier (i.e., at node 28) is above a predetermined level, then the gain of the full-wave rectifier is decreased, thereby lowering the output power level at terminal 29. Conversely, if the power level at node 28 is less than a predetermined level, then the gain of the full-wave rectifier is increased, thereby increasing the output power level at terminal 29.

Thus, the output power level at output terminal 29 is substantially independent of the input power level at input terminal 18.

Figure 2:
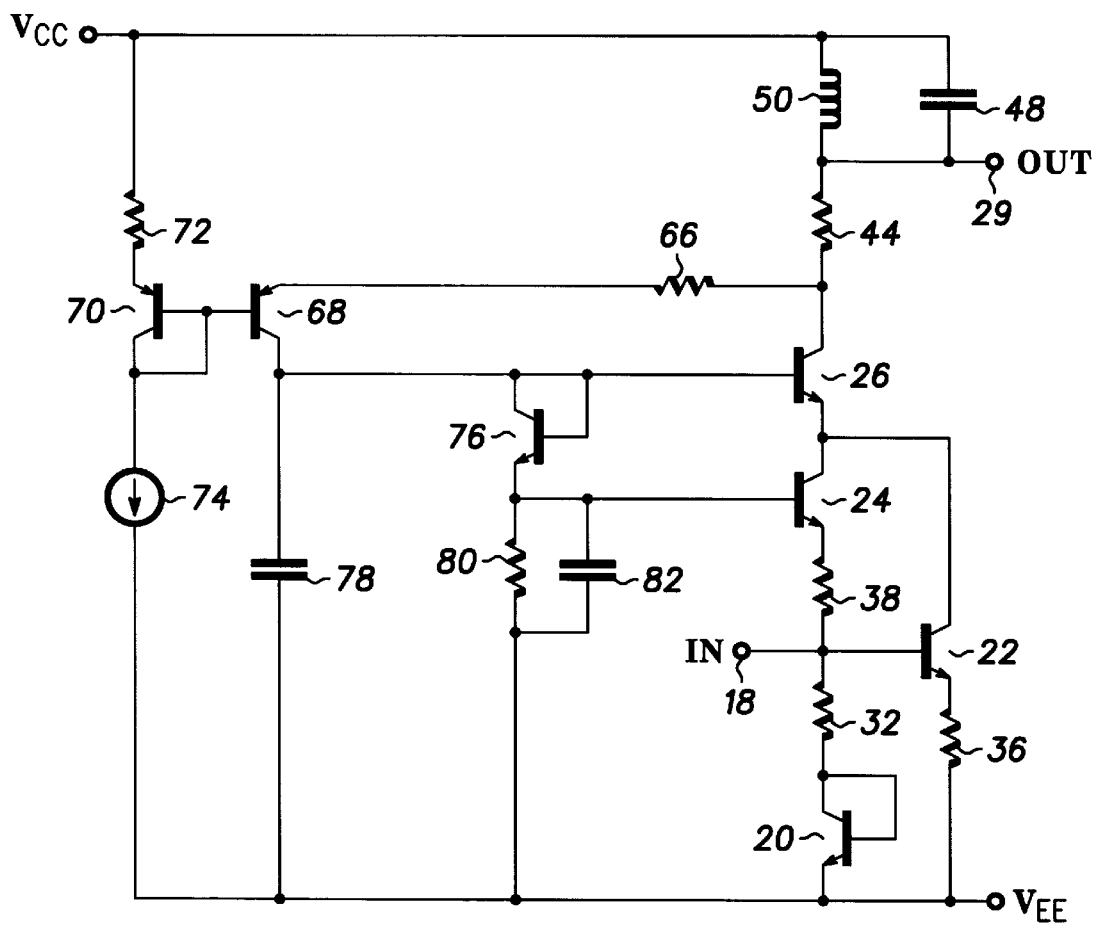
FIG. 2 is a schematic diagram of a frequency doubling circuit in accordance with a second embodiment of the invention.

FIG. 2 is a schematic diagram of a frequency doubling circuit in accordance with a second embodiment of the invention. It should be understood that the same reference numerals are used in the figures to denote the same elements. In accordance with the illustrated embodiment, comparator amplifier 46 comprises a transistor 68 having its emitter coupled to the collector of transistor 26 through a resistor 66. The base of transistor 68 is coupled to the base of a bipolar junction transistor 70. The reference voltage VREF is generated across resistor 72 by the current source 74 through transistor 70. This value is compared to the output of buffer transistor 26 via bipolar junction transistor 68.

The signal from the collector of transistor 68 is transmitted to the base of buffer transistor 26 for biasing transistor 26. This same signal travels through a diode-connected bipolar junction transistor 76 to the base of transistor 24. Diode-connected transistor 76 serves to lower the level of the control signal from that used at the base of transistor 26. This signal is the control signal that controls the gain of the full-wave rectifier. A capacitor 78 and a capacitor 82 serve to decouple the Alternating Current (AC) component of the signal from the bases of transistor 26 and transistor 24, respectively. A resistor 80 serves to present a load to transistor 68 and to provide a current for transistor 76.

Figure 3:
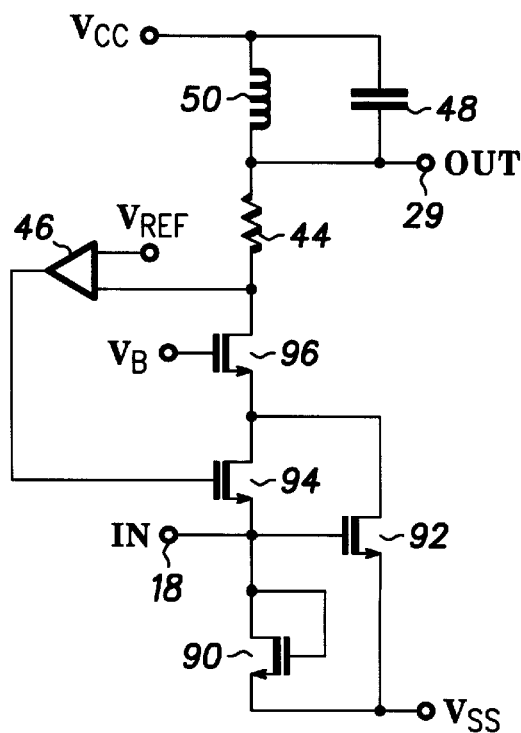
FIG. 3 is a schematic diagram of a frequency doubling circuit in accordance with a third embodiment of the invention.

FIG. 3 is a schematic diagram of a frequency doubling circuit in accordance with a third embodiment of the invention using field effect transistors. In the full-wave rectifier portion of the circuit of FIG. 3, a field effect transistor 90 corresponds to bipolar junction transistor 20 of FIG. 1. A field effect transistor 92 corresponds to bipolar junction transistor 22. Finally, a field effect transistor 94 corresponds to bipolar junction transistor 24. The buffer bipolar junction transistor 26 of FIG. 1 corresponds to a buffer field effect transistor 96 in FIG. 3. Input terminal 18, output terminal 29, capacitor 48, inductor 50, resistor 44, and comparator amplifier 46 all function in the same manner as the like numbered elements shown in FIG. 1. In this embodiment, comparator amplifier 46 may be implemented in a similar manner to that shown in FIG. 2, but using field effect transistors instead of bipolar junction transistors.

FIG. 3 thus shows that the circuit is not limited to bipolar junction transistors, but can be implemented with any transistor having a control electrode (such as a base or a gate) for controlling the current through first and second current carrying electrodes (such as an emitter and collector or a source and drain).

Thus, it is apparent that there has been provided, in accordance with the invention, a frequency doubling circuit and method that fully meet the needs set forth above. In particular, in accordance with various embodiments of the invention, there has been provided a circuit and method that doubles the frequency of an input signal while providing an output signal that is resistant to fluctuations in the power of the input signal.

The present invention has been described above with reference to various embodiments. However, those skilled in the art will recognize that changes and modifications may be made in these embodiments without departing from the scope of the invention. For example, the full-wave rectifier may be implemented using a different circuit. The resistor values in the full-wave rectifier portion of the bipolar junction transistor circuit can be changed, or even removed to result in a different input impedance. The type of transistor used to implement the frequency doubling circuit can be reversed, with PNP transistors substituted for the NPN transistors and NPN transistors substituted for the PNP transistors. In like manner, in a field effect transistor embodiment of the circuit, the n-channel field effect transistors can be replaced with p-channel field effect transistors and the p-channel field effect transistors can be replaced with n-channel field effect transistors. The base voltage $V_B$ can be either set to a fixed level or determined by the comparator amplifier. It is understood that this invention is not limited to the particular forms shown and it is intended for the appended claims to cover these and all other modifications of the invention which fall within the true spirit and scope of the invention.

What is claimed is:

1. A circuit, comprising:
    a first transistor having a control electrode, a first current carrying electrode, and a second current carrying electrode;
    a current mirror having a first terminal and a second terminal, wherein the first terminal of the current mirror is coupled to an input of the circuit and to the first current carrying electrode of the first transistor; and
    a buffer amplifier having a first terminal, a second terminal, and a third terminal, wherein the first terminal of the buffer amplifier is coupled to the second current carrying electrode of the first transistor and to the second terminal of the current mirror and wherein the second terminal of the buffer amplifier is coupled to the control electrode of the first transistor and to an output of the circuit.

2. The circuit of claim 1, wherein the current mirror comprises:
    a second transistor having a control electrode, a first current carrying electrode, and a second current carrying electrode; and
    a diode having an anode and a cathode;
    wherein the anode of the diode and the control electrode of the second transistor are coupled to the first current carrying electrode of the first transistor;
    the cathode of the diode and the first current carrying electrode of the second transistor are coupled for receiving a first power supply voltage;
    the second current carrying electrode of the second transistor is coupled to the first terminal of the buffer amplifier.

3. The circuit of claim 2, wherein the diode comprises a diode-connected transistor comprising a control electrode, a first current carrying electrode, and a second current carrying electrode, wherein the first current carrying electrode of the diode-connected transistor is coupled to the control electrode of the diode-connected transistor to form the anode of the diode and the second current carrying electrode forms the cathode of the diode.

4. The circuit of claim 2, wherein the buffer amplifier comprises a third transistor having a control electrode, a first current carrying electrode, and a second current carrying electrode, wherein the first current carrying electrode of the third transistor is coupled to the second current carrying electrode of the first transistor.

5. A circuit, comprising:
    a first transistor having a control electrode, a first current carrying electrode, and a second current carrying electrode;
    a current mirror having an input and an output, wherein the input of the current mirror is coupled to the first current carrying electrode of the first transistor and to an input of the circuit;

a buffer amplifier having an input, an output coupled to an output of the circuit, and a control terminal, wherein the input of the buffer amplifier is coupled to the second current carrying electrode of the first transistor and to the output of the current mirror; and a feedback circuit coupled between the output of the buffer amplifier and the control electrode of the first transistor.

6. The circuit of claim 5, wherein the feedback circuit comprises a comparator amplifier having a first input coupled to the output of the buffer amplifier, a second input coupled for receiving a reference voltage, and an output coupled to the control electrode of the first transistor.

7. The circuit of claim 6 wherein the comparator amplifier comprises:

a first resistor having a first terminal coupled to the output of the buffer amplifier;

a second transistor having a control electrode, a first current carrying electrode coupled to a second terminal of the first resistor, and a second current carrying electrode coupled to the control terminal of the buffer amplifier;

a third transistor having a control electrode coupled to the control electrode of the second transistor, a first current carrying electrode, and a second current carrying electrode coupled to the control electrode of the third transistor;

a second resistor having a first terminal coupled to the first current carrying electrode of the third transistor and a second terminal coupled for receiving a first power supply voltage;

a current source coupled to the second current carrying electrode of the third transistor;

a diode having an anode coupled to the control terminal of the buffer amplifier and a cathode coupled to the control electrode of the first transistor;

a third resistor having a first terminal coupled to the cathode of the diode and a second terminal coupled for receiving a second power supply voltage;

a first capacitor having a first terminal coupled to the control electrode of the first transistor and a second terminal coupled for receiving the second power supply voltage; and a second capacitor having a first terminal coupled to the anode of the diode and a second terminal coupled to the second power supply voltage.

8. The circuit of claim 7 wherein the diode comprises a diode-connected transistor having a control electrode coupled to the control electrode of the buffer amplifier, a first current carrying electrode coupled to the control electrode of the diode-connected transistor, and a second current carrying electrode coupled to the control electrode of the first transistor.

9. A method for altering a frequency of an input signal comprising the steps of:

rectifying the input signal using a full-wave rectifier to produce an output signal;

comparing a DC component of the output signal to a reference voltage and generating a feedback signal in response to the comparison; and applying the feedback signal to the full-wave rectifier to control the output signal.

10. The method of claim 9, wherein the step of applying includes controlling the output signal so that a power level of the output signal is substantially independent of a power level of the input signal.

11. The method of claim 9, wherein the step of rectifying includes rectifying the input signal so that a frequency of the output signal is double the frequency of the input signal.

12. A circuit, comprising:

a full-wave rectifier having a first terminal, a second terminal, and a third terminal coupled to an input of the circuit;

a band-pass filter having a first terminal coupled to the second terminal of the full-wave rectifier and to an output of the circuit; and a feedback circuit having a first terminal coupled to the second terminal of the full-wave rectifier and a second terminal coupled to the first terminal of the full-wave rectifier, wherein the feedback circuit comprises a comparator having a first terminal coupled to the second terminal of the full-wave rectifier and a second terminal coupled to the first terminal of the full-wave rectifier.

13. A circuit, comprising:

a full-wave rectifier having a first terminal, a second terminal, and a third terminal coupled to an input of the circuit;

a band-pass filter having a first terminal coupled to the second terminal of the full-wave rectifier and to an output of the circuit; and a feedback circuit having a first terminal coupled to the second terminal of the full-wave rectifier and a second terminal coupled to the first terminal of the full-wave rectifier;

wherein the full-wave rectifier comprises:

a first transistor having a control electrode coupled to the second terminal of the feedback circuit, a first current carrying electrode coupled to the first terminal of the band-pass filter, and a second current carrying electrode coupled to the input of the circuit;

a second transistor having a control electrode coupled to the second current carrying electrode of the first transistor, a first current carrying electrode coupled to the second current carrying electrode of the first transistor, and a second current carrying electrode coupled for receiving a power supply voltage; and a third transistor having a control electrode coupled to the second current carrying electrode of the first transistor, a first current carrying electrode coupled to the first current carrying electrode of the first transistor, and a second current carrying electrode coupled for receiving the power supply voltage.

14. A circuit, comprising:

a first transistor having a control electrode, a first current carrying electrode, and a second current carrying electrode coupled to an input of the circuit;

a second transistor having a control electrode coupled to the input of the circuit, a first current carrying electrode coupled to the input of the circuit, and a second current carrying electrode;

a third transistor having a control electrode coupled to the input of the circuit, a first current carrying electrode coupled to the first current carrying electrode of the first transistor, and a second current carrying electrode coupled to the second current carrying electrode of the second transistor; and a feedback circuit having a first terminal and a second terminal, wherein the second terminal of the feedback circuit is coupled to the control electrode of the first transistor and wherein the first terminal of the feedback circuit is coupled to the first current carrying electrode of the first transistor and to an output of the circuit.

15. The circuit of claim 14, further comprising a fourth transistor having a control electrode, a first current carrying electrode coupled to the first terminal of the feedback circuit, and a second current carrying electrode coupled to the first current carrying electrode of the first transistor.

16. The circuit of claim 14, wherein the feedback circuit comprises a comparator having a first terminal coupled to the first current carrying electrode of the first transistor and a second terminal coupled to the control electrode of the first transistor.

17. The circuit of claim 14, further including a filter having a first terminal coupled to the output of the circuit and a second terminal coupled for receiving a source of operating potential.

18. The circuit of claim 17, wherein the filter is a band-pass filter.

* * * * *